(12) United States Patent
Taguchi

(10) Patent No.: US 6,451,457 B1
(45) Date of Patent: Sep. 17, 2002

(54) ORGANIC LUMINOUS DEVICE MATERIAL COMPRISING 1,2,4-OXADIAZOLE COMPOUND, AND ORGANIC LUMINOUS DEVICE USING THE SAME

(75) Inventor: Toshiki Taguchi, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/400,180

(22) Filed: Sep. 21, 1999

(30) Foreign Application Priority Data

Sep. 21, 1998 (JP) .......................................... 10-266594

(51) Int. Cl.⁷ ............................. H05B 33/00; B32B 9/00
(52) U.S. Cl. ................. 428/690; 548/131; 252/301.16; 313/504
(58) Field of Search ................................ 428/690, 917; 548/131; 252/301.16; 313/504

(56) References Cited

U.S. PATENT DOCUMENTS

| | | | | |
|---|---|---|---|---|
| 3,862,168 A | * | 1/1975 | Findeisen et al. | 260/307 G |
| 5,306,572 A | * | 4/1994 | Ohashi et al. | 428/690 |
| 5,955,209 A | * | 9/1999 | Murata et al. | 428/690 |
| 6,107,452 A | * | 8/2000 | Miller et al. | 528/422 |

FOREIGN PATENT DOCUMENTS

EP 0 305 197 * 3/1989 ........... C04B/35/54

OTHER PUBLICATIONS

The 6th Lecture Preprint, Molecular Electronics and Bioelectronics, Nov. 12, 1998, pp. 11–19, pp. 31–41, pp. 53–61.

* cited by examiner

*Primary Examiner*—Cynthia H. Kelly
*Assistant Examiner*—Dawn Garrett
(74) *Attorney, Agent, or Firm*—Sughrue Mion, PLLC

(57) ABSTRACT

A material for an organic luminous device, which comprises a 1,2,4-oxadiazole compound represented by formula (1) or a precursor thereof, or comprises a homopolymer or copolymer produced from monomers comprising at least one monomer unit derived from said 1,2,4-oxadiazole compound represented by formula (1):

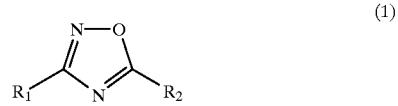

(1)

wherein $R_1$ and $R_2$ each independently represents a hydrogen atom, an alkyl group, an alkenyl group, an alkynyl group, an aryl group or a heterocyclic group. Also disclosed is an organic luminous device containing the material.

7 Claims, No Drawings

ORGANIC LUMINOUS DEVICE MATERIAL COMPRISING 1,2,4-OXADIAZOLE COMPOUND, AND ORGANIC LUMINOUS DEVICE USING THE SAME

FIELD OF THE INVENTION

The present invention relates to an organic luminous device material comprising a 1,2,4-oxadiazole compound. Furthermore, the invention also relates to an organic luminous device using the material.

BACKGROUND OF THE INVENTION

At present, the researches and developments of various display devices have been actively made. Regarding organic luminous devices, particularly, various systems have been examined, and many ideas have been proposed. In particular, organic electroluminescence (EL) devices are receiving attention as promising display devices because they can emit light of high luminance with low voltage. For example, EL devices having organic thin layers formed by vapor deposition of organic compounds are known (*Applied Physics Letters*, 51, p.913 (1987)). The organic EL devices described in the above literature have a laminated structure of an electron transport material and a hole transport material, and show substantial improvements in their luminescence characteristics over conventional single-layer devices.

The electron transport material used in those devices of lamination type, specifically the hydroxyquinoline-aluminum complex (hereinafter abbreviated as "Alq"), is one of the most effective electron transport materials. However, Alq fluoresces a green light, so that it is not suitable for producing blue luminous devices and white luminous devices. In addition, Alq is unsuitable for organic EL devices of coated type because of its extremely low solubilities in organic solvents.

As electron transport materials capable of taking the place of Alq, the use of heterocyclic compounds has been considered. With respect to the techniques of using 1,3,4-oxadiazole compounds or 1,3,4-triazole compounds as electron transport materials, various compounds and the examination results thereof have been reported as described, for example, in *the 6th Lecture Preprint* by the Organic molecules-bioelectronics Division of Japanese Society of Applied Physics, pp. 11–19, pp. 31–41 and pp. 53–61 (1997).

As a result of the studies made by the present inventor on the above-mentioned compounds, it turned out that those compounds still failed to provide organic EL devices having high luminance and stability, as compared to Alq. Particularly, in case where those compounds are applied to organic EL devices of coated type, they had a problem of being liable to separate out from the coated layer because of their poor solubilities. This problem is directed not only to organic EL devices but also to the whole Organic luminous devices, and hence the dissolution thereof has been desired.

SUMMARY OF THE INVENTION

Therefore, a first object of the invention is to develop heterocyclic compounds having good electron transport capability and to develop an organic luminous device material suitable for the production of an organic luminous device having high luminance.

A second object of the invention is to develop an organic luminous device material having excellent solubility and suitability for the production of an organic luminous device having a long life even when the device is produced using a coating technique. In particular, the development of an organic EL device of excellent quality is aimed at by the invention.

Other objects and effects of the present invention will become apparent from the following description.

The above-described objectives of the present invention have been achieved by providing the following materials for an organic luminous device and organic luminous devices.

1) A material for an organic luminous device, which comprises a 1,2,4-oxadiazole compound represented by formula (1) or a precursor thereof, or comprises a homopolymer or copolymer produced from monomers comprising at least one monomer unit derived from said 1,2,4-oxadiazole compound represented by formula (1):

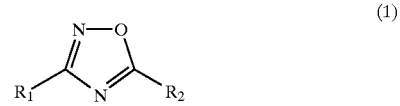

wherein $R_1$ and $R_2$ each independently represents a hydrogen atom, an alkyl group, an alkenyl group, an alkynyl group, an aryl group or a heterocyclic group.

2) The material according to the above 1), wherein $R_1$ and $R_2$ in formula (1) each independently is an aryl group or a heterocyclic group.

3) The material according to the above 1), wherein either or both of $R_1$ and $R_2$ is substituted with a fluorine atom or a substituent containing a fluorine atom.

4) An organic luminous device comprising a material according to the above 1).

5) The organic luminous device according to the above 4), which comprises a coated organic layer, wherein said coated organic layer contains said material.

DETAILED DESCRIPTION OF THE INVENTION

The compound represented by formula (1) is described in detail below.

$R_1$ and $R_2$ each independently represents a hydrogen atom, an alkyl group (preferably containing 1 to 30 carbon atoms, more preferably 1 to 15 carbon atoms, particularly preferably 1 to 8 carbon atoms, with examples thereof including methyl, t-butyl and cyclohexyl groups), an alkenyl group (preferably containing 2 to 30 carbon atoms, more preferably 2 to 15 carbon atoms, particularly preferably 2 to 8 carbon atoms, with examples thereof including vinyl, 1-propenyl, 1-butene-2-yl and cyclohexene-1-yl groups), an alkynyl group (preferably containing 2 to 30 carbon atoms, more preferably 2 to 15 carbon atoms, particularly preferably 2 to 8 carbon atoms, with examples thereof including ethynyl and 1-propynyl groups), an aryl group (preferably containing 6 to 30 carbon atoms, more preferably 6 to 15 carbon atoms, particularly preferably 6 to 12 carbon atoms, with examples thereof including phenyl, tolyl, xylyl, naphthyl, biphenyl and pyrenyl groups) or a heterocyclic group (preferably a 5- or 6-membered heterocyclic group, which may be fused together with another ring, containing a nitrogen, oxygen or sulfur atom as a hetero atom in addition to 1 to 30 carbon atoms, preferably 2 to 15 carbon atoms, more preferably 2 to 8 carbon atoms, with examples thereof including pyridyl, piperidyl, oxazolyl, oxadiazolyl, tetrahydrofuryl and thienyl groups). Of these, aryl groups and heterocyclic groups are particularly preferred. These groups may further have substituents.

Examples of the substituent which can be contained in the groups represented by $R_1$ and $R_2$ include an alkyl group (preferably containing 1 to 20 carbon atoms, more preferably 1 to 12 carbon atoms, particularly preferably 1 to 8 carbon atoms, with examples thereof including methyl, ethyl, iso-propyl, tert-butyl, n-octyl, n-decyl, n-hexadecyl, cyclopropyl, cyclopentyl and cyclohexyl groups), an alkenyl group (preferably containing 2 to 20 carbon atoms, more preferably 2 to 12 carbon atoms, particularly preferably 2 to 8 carbon atoms, with examples thereof including vinyl, allyl, 2-butenyl and 3-pentenyl groups), an alkynyl group (preferably containing 2 to 20 carbon atoms, more preferably 2 to 12 carbon atoms, particularly preferably 2 to 8 carbon atoms, with examples thereof including propargyl and 3-pentynyl groups), an aryl group (preferably containing 6 to 30 carbon atoms, more preferably 6 to 20 carbon atoms, particularly preferably 6 to 12 carbon atoms, with examples thereof including phenyl, p-methylphenyl and naphthyl groups), an alkoxy group (preferably containing 1 to 20 carbon atoms, more preferably 1 to 16 carbon atoms, particularly preferably 1 to 12 carbon atoms, with examples thereof including methoxy, ethoxy, butoxy, tert-butoxy, 2-ethylhexyloxy and dodecyloxy groups), a substituted carbonyl group (preferably containing 2 to 20 carbon atoms, more preferably 2 to 16 carbon atoms, particularly preferably 2 to 12 carbon atoms, with examples thereof including acetyl, benzoyl, methoxycarbonyl, phenyloxycarbonyl, dimethylamino-carbonyl and phenylaminocarbonyl groups), an amino group (preferably containing 0 to 20 carbon atoms, more preferably 2 to 16 carbon atoms, particularly preferably 2 to 12 carbon atoms, with examples thereof including dimethylamino, methylcarbamoyl, ethylsulfonylamino, dimethylaminocarbonylamino and phthal-imido groups), a sulfonyl group (preferably containing 1 to 20 carbon atoms, more preferably 1 to 16 carbon atoms, particularly preferably 1 to 12 carbon atoms, with examples thereof including mesyl and tosyl groups), -a sulfo group, a carboxyl group, a heterocyclic group (preferably containing a nitrogen, oxygen or sulfur atom as a hetero atom in addition to 1 to 50 carbon atoms, preferably 1 to 30 carbon atoms, more preferably 2 to 12 carbon atoms, with examples thereof including imidazolyl, pyridyl, furyl, piperidyl, morpholino, benzoxazolyl and triazolyl groups), a hydroxyl group, an aryloxy group (preferably containing 6 to 20 carbon atoms, more preferably 6 to 16 carbon atoms, particularly preferably 6 to 12 carbon atoms, with examples thereof including phenoxy and naphthyloxy groups), a halogen atom (preferably fluorine, chlorine, bromine or iodine atom, particularly preferably fluorine atom), a thiol group, an alkylthio group (preferably containing 1 to 20 carbon atoms, more preferably 1 to 16 carbon atoms, particularly preferably 1 to 12 carbon atoms, e.g., methylthio), an arylthio group (preferably containing 6 to 20 carbon atoms, more preferably 6 to 16 carbon atoms, particularly preferably 6 to 12 carbon atoms, e.g., phenylthio) and a cyano group. Of these substituents, the alkyl, aryl, heterocyclic and alkoxy groups and a fluorine atom are preferred. In particular, it is preferred that the compound has at least one fluorine atom or a substituent having at least one fluorine atom (e.g., fluoromethyl, trifluoromethyl, perfluorooctyl).

The 1,2,4-oxadiazole compounds represented by formula (1) can be synthesized using known methods. In general, those compounds can be synthesized by heating aliphatic or aromatic nitrites together with excess hydroxylamine in an alcohol-water mixed solvent to convert it to the corresponding amidoximes, and then making the amidoximes react with esters, acid halides or acid anhydrides in a condition that the amidoximes are dissolved in absolute alcohol and dissociated by the use of a metal alkoxide as a base.

Accordingly, the 1,2,4-oxadiazole compounds may be synthesized in such a manner that the amidoximes as precursors thereof are incorporated together with esters, acid halides or acid anhydrides in the organic layer of an organic luminous device and these they are made to react with each other inside the organic layer, e.g., by applying heat thereto.

The monomer units derived from the 1,2,4-oxadiazole compounds include two embodiments. In one embodiment, the compound constitutes a monomer unit by itself. In the other embodiment, on the other hand, the compound and a polymerizable unsaturated compound (e.g., a vinyl compound) combine to constitute a monomer unit. Examples of the monomer unit of the latter embodiment include the monomer units derived from polymerizable ethylenic unsaturated compounds, such as (meth)acrylic acid (esters) and (meth)acrylamides.

In the invention, homopolymers formed from these monomer units alone and copolymers formed from these monomer units and other copolymerizable unsaturated compounds (the representatives of which are the vinyl compounds as recited above) can be used. The number-average molecular weight of the (co)polymer used as an organic luminous device material is preferably not higher than $1.00 \times 10^6$ preferably from $1 \times 10^4$ to $2.0 \times 10^5$.

The 1,2,4-oxadiazole compounds and the polymers derived therefrom according to the present invention can be used in a combination of two or more thereof.

Examples of the compound according to the invention are shown below:

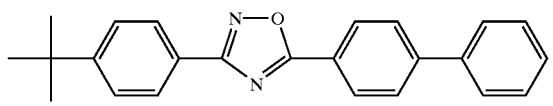

EC-1

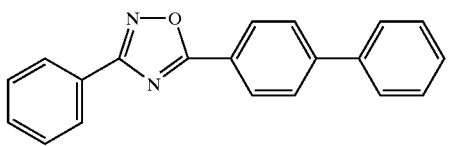

EC-2

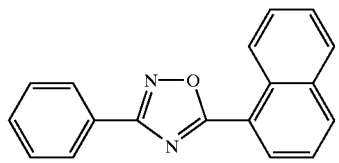

EC-3

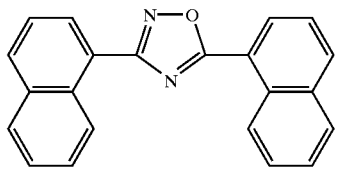

EC-4

-continued
EC-5
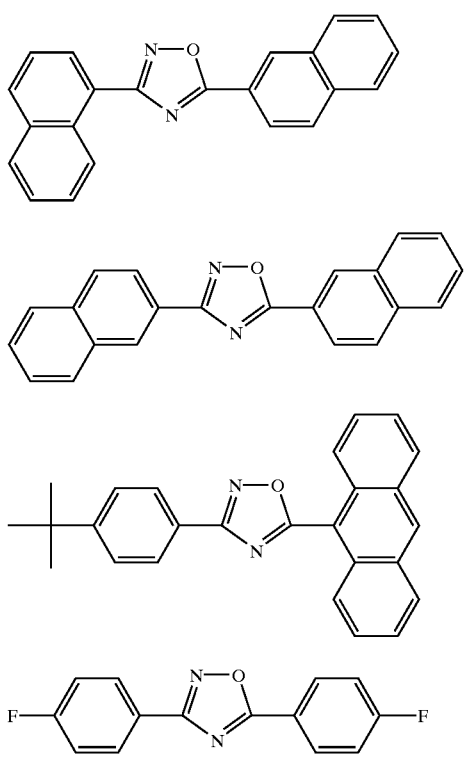
EC-6
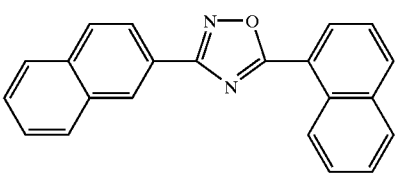
EC-7
EC-8
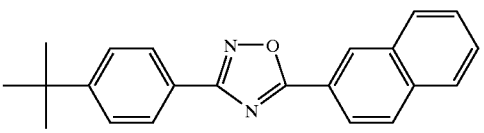
EC-9
EC-10
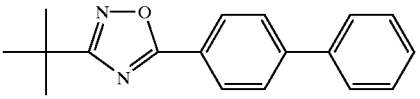
EC-11
EC-12
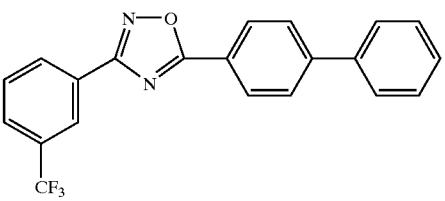
EC-13
EC-14
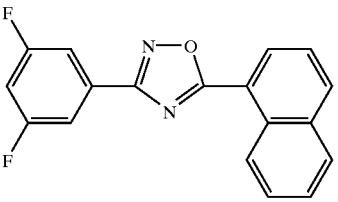
EC-15
EC-16
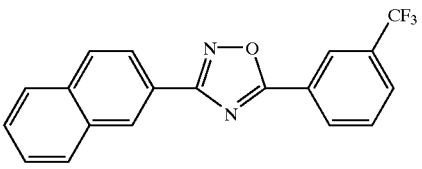
EC-17
EC-18
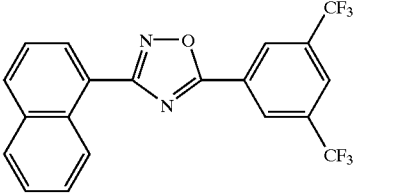
EC-19
EC-20
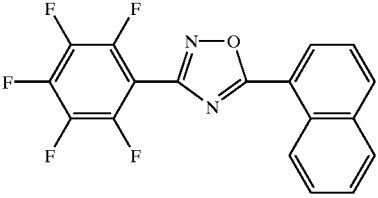

-continued
EC-21
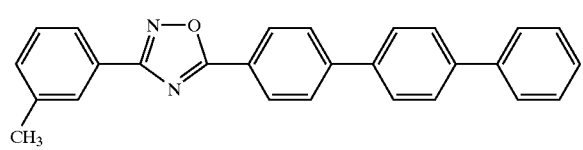
EC-22
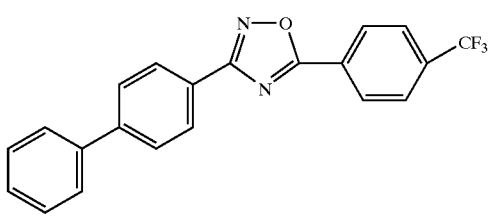
EC-23
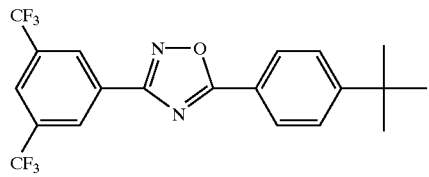
EC-24
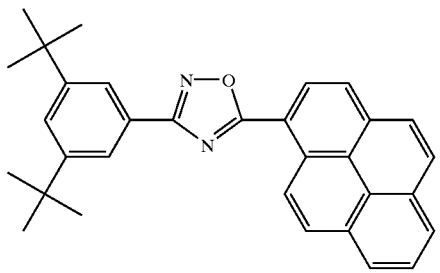
EC-25
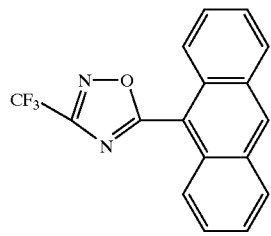
EC-26
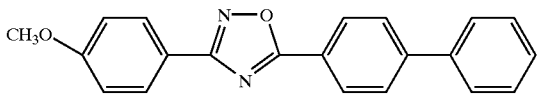
EC-27
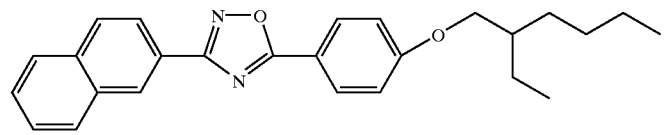
EC-28
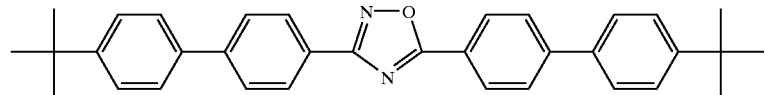
EC-29
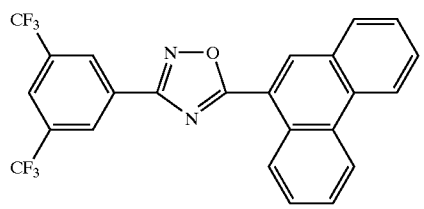
EC-30
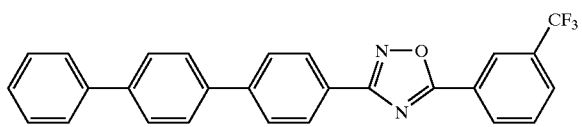

-continued
EC-31
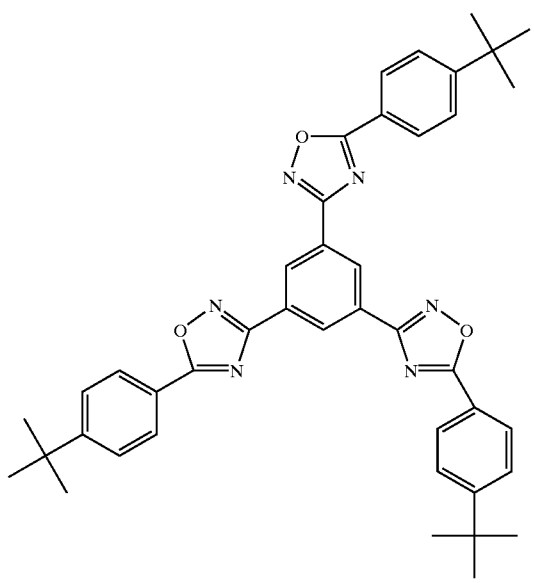
EC-32
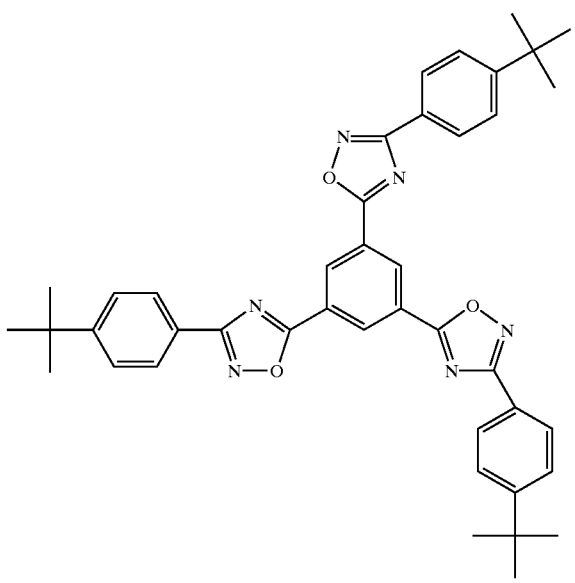
EC-33
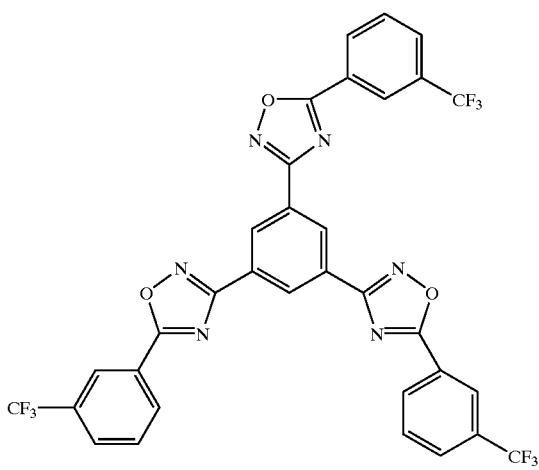
EC-34
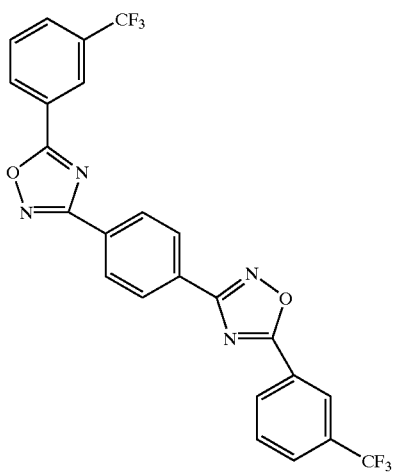
EC-35
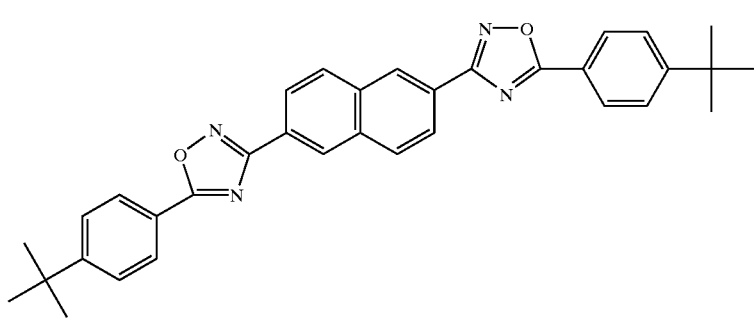

-continued

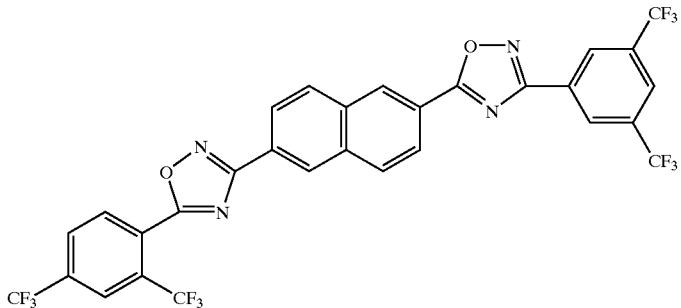

EC-36

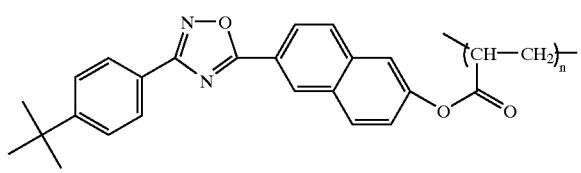

EC-37

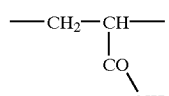

EC-38

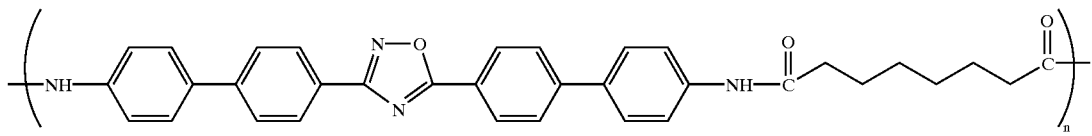

EC-39

Next, the organic luminous device having an organic layer containing the compound according to the invention is described in detail below.

The organic layer of an organic luminous device containing the compound of the invention has no particular restrictions as to the formation method. Various methods, such as a resistance heating vapor deposition method, an electron-beam method, a sputtering method, a molecular lamination method and a coating method, can be adopted. In particular, the resistance heating vapor deposition method and the coating method are preferred from the viewpoints of the characteristics and production of luminous devices.

The present luminous device is a device having an organic layer formed between a pair of electrodes, an anode and a cathode. More specifically, the organic layer may be composed of a luminous layer alone or a plurality of organic compound thin layers including a luminous layer. Besides the luminous layer, the device may have other layers such as a hole injection layer, a hole transport layer, an electron injection layer, an electron transport layer and a protective layer. These layers each may have another function. For forming each layer, various materials can be employed.

The anode supplies holes to a layer such as the hole injection layer, the hole transport layer and the luminous layer. As a material for the anode, metals, alloys, metal oxides, electrically conductive materials and mixtures thereof can be used. Materials having a work function of at least 4 eV are preferably used. Examples of such materials include conductive metal oxides, such as tin oxide, zinc oxide, indium oxide and indium tin oxide (ITO), metals such as gold, silver, chromium and nickel, mixtures or laminates of those metals and conductive metal oxides, inorganic conductive materials such as copper iodide and copper sulfide, organic conductive materials such as polyaniline, polylthiophene and polypyrrole, and laminates of those materials and ITO. Of the materials recited above, conductive metal oxides are preferred and ITO is particularly preferred from the viewpoint of productivity, conductivity and transparency. The thickness of the anode, though can be appropriately selected depending on the anode material, is preferably from 10 nm to 4 µm, more preferably 50 nm to 1 µm, particularly preferably 100 nm to 500 nm.

In general, a layer formed on a soda lime glass, alkali-free glass or transparent resin substrate is used as the anode. In a case of using a glass substrate, alkali-free glass is preferred from the viewpoint of reduction in ions eluted from the glass. When soda glass is used, it is desirable that a barrier coat, such as silica, be provided on the glass. The thickness of the substrate has no particular limitation as long as the substrate can ensure mechanical. strength for the anode. For instance, the thickness of the glass substrate is suitably at least 0.2 mm, preferably at least 0.7 mm.

Various methods can be used for making the anode depending on the material used. In the case of ITO, for example, the layer formation can be carried out using an electron-beam method, a sputtering method, a resistance heating vapor deposition method, a chemical reaction method (e.g., sol-gel method), or a method of coating a dispersion of indium tin oxide. Washing and other treatments for the anode may be carried out in order to decrease the driving voltage of the device or to improve luminous efficiency. In the case of using ITO, UV-ozone treatment and plasma treatment are effective.

The cathode supplies electrons to a layer such as the electron injection layer, the electron transport layer and the luminous layer. In selecting the cathode, the adhesion to the adjacent layer such as the electron injection layer, electron transport layer or luminous layer, ionization potential and the stability are taken into consideration. As a material for the cathode, metals, alloys, metal halides, metal oxides, electrically conductive materials and mixtures thereof can be employed. Examples of such materials include alkali metals (e.g., Li, Na, K) and the fluorides thereof, alkaline earth metals (e.g., Mg, Ca) and the fluorides thereof, gold, silver, lead, aluminum, Na-K alloy and mixtures thereof, Li-Al alloy and a mixture of these metals, Mg-Ag alloy and a mixture of these metals, and rare earth metals (e.g., In, Yb). Of these materials, materials having a work function of at most 4 eV are preferred. In particular, aluminum, Li-Al alloy and a mixture of these metals and Mg-Ag alloy and a mixture of these metals are preferably used. The cathode structure may be a single-layer of the compound or mixture as recited above or a lamination including the compound(s) or mixture(s) as recited above. The thickness of the cathode, though can be appropriately selected depending on the cathode material, is suitably from 10 nm to 4 $\mu$m, preferably 50 nm to 1 $\mu$m, particularly preferably 100 nm to 500 nm. In forming the cathode, various known methods, such as an electron-beam method, a sputtering method, a resistance heating vapor deposition method and a coating method, can be adopted. The metals as recited above may be vapor deposited independently, or two or more thereof may be vapor deposited simultaneously. Further, it is possible to vapor deposit a plurality of metals at the same time to form an alloy electrode, or to vapor deposit the previously prepared alloy. It is advantageous to the luminous device that both anode and cathode have low sheet resistance, specifically several hundreds $\Omega$/square at the highest.

A material for the luminous layer may be any, so long as it can form a layer having a function of enabling injection of holes thereto from the anode or the hole injection layer together with enabling injection of electrons thereto from the cathode, the electron injection layer or the electron transport layer upon application of an electric field, a function of moving the injected charges, and a function of providing a field for recombination of the holes and the electrons to emit light. Preferably, the luminous layer contains a metal complex. However, other luminous materials can also be used. Examples of such luminous materials include benzoxazole derivatives, benzimidazole derivatives, benzothiazole derivatives, styrylbenzene derivatives, polyphenyl derivatives, diphenylbutadiene derivatives, tetraphenyl-butadiene derivatives, naphthalimide derivatives, coumarin derivatives, perylene derivatives, perynone derivatives, oxadiazole derivatives, aldazine derivatives, pyralidine derivatives, cyclopentadiene derivatives, bisstyryl-anthracene derivatives, quinacridone derivatives, pyrrolopy-ridine derivatives, thiadiazolopyridine derivatives, styry-lamine derivatives, aromatic dimethylidyne derivatives, various metal complexes represented by metal or rare earth complexes of 8-quinolinol derivatives, and polymeric compounds such as polythiophene, polyphenylene and polyphenylene-vinylene. Although the luminous layer has no particular restrictions as to the thickness, the suitable thickness thereof is generally from 1 nm to 5 $\mu$m, preferably 5 nm to 1 $\mu$m, particularly preferably 10 nm to 500 nm. As to the method of forming the luminous layer, there is no particular restrictions, but various methods including a resistance heating vapor deposition method, an electron-beam method, a sputtering method, a molecular lamination method, a coating method (e.g., a spin coating, cast coating or dip coating method) and LB method can be adopted. Of these methods, resistance heating vapor deposition and coating methods are preferred.

Materials for the hole injection layer and the hole transport layer may be any materials so long as they have any of a function of injecting holes from the anode, a function of transporting holes injected and a function of forming a barrier against electrons injected from the cathode. Examples of such materials include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, and conductive polymers and oligomers such as poly(N-vinylcarbazole) derivatives, aniline copolymers, thiophene oligomers and polythiophene. The thickness of the hole injection layer and the hole transport layer each, though it has no particular limitation, is generally from 1 nm to 5 $\mu$m, preferably 5 nm to 1 $\mu$m, particularly preferably 10 nm to 500 nm. Each of the hole injection layer and the hole transport layer may have a single-layer structure comprising one or more of the materials recited above or a multiple-layer structure composed of at least two layers having the same composition or different compositions. As a method of forming the hole injection layer and the hole transport layer, a vacuum evaporation method, LB method and a method of coating the compound capable of injecting or transporting holes in the form of a solution or dispersion in an appropriate solvent (using, e.g., a spin coating, cast coating or dip coating method) can be adopted. In a case of adopting the coating method, the compound can be dissolved or dispersed in the presence of a resin component. Examples of the resin component for use herein include polyvinyl chloride, polycarbonate, polystyrene, polymethyl methacrylate, poly-butyl methacrylate, polyester, polysulfone, polyphenylene oxide, polybutadiene, poly(N-vinylcarbazole), hydrocarbon resin, ketone resin, phenoxy resin, polyamide, ethyl cellulose, polyvinyl acetate, ABS resin, polyurethane, melamine resin, unsaturated polyester resin, alkyd resin, epoxy resin and silicone resin.

Materials for the electron injection layer and the electron transport layer may be any materials so long as they have any of a function of injecting electrons from the cathode, a function of transporting electrons and a function of forming a barrier against holes injected from the anode. Examples of known compounds for use as such materials include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodimide derivatives, fluore-nylidenemethane derivatives, distyryipyrazine derivatives, heterocyclic tetracarboxylic acid anhydrides such as naphthaleneperylene, phthalocyanine derivatives, and various metal complexes represented by metal complexes of 8-quinolinol derivatives, metallo-phthalocyanine and metal complexes containing benzoxazole or benzothiazole as ligands. Also, the compounds of the present invention can be used as electron transport or electron injection material. The thickness of the electron injection layer and the electron transport layer each, though it has no particular limitation, is generally from 1 nm to 5 $\mu$m, preferably 5 nm to 1 $\mu$m, particularly preferably 10 nm to 500 nm. Each of the electron injection layer and the electron transport layer may have a single-layer structure comprising one or more compounds according to the invention or a combination of compound(s) according to the invention and the known compound(s) as recited above, or a multiple-layer structure composed of at least two layers having the same composition or different compositions. As a method of forming the electron injection layer and the electron transport layer, a vacuum evaporation method, LB method and a method of coating the compound(s) capable of injecting or transporting electrons in the form of a solution or dispersion in an appropriate solvent (using, e.g., a spin coating, cast coating or dip coating method) can be adopted. In the case of coating, the material may be a polymeric compound among the compounds according to the invention, and can be dissolved or dispersed together with a resin component. As the resin component, the resins recited above in connection with the hole injection and transport layers can be employed.

The compound according to the present invention is preferably used in the electron transport layer and/or the electron injection layer. The compound according to the invention can also be used in the luminous layer.

The materials for a protective layer may be any substances so long as they have a function capable of inhibiting invasion of a device deterioration promoter, such as moisture or oxygen, into the device. Examples of such a substance include metals, such as In, Sn, Pb, Au, Cu, Ag, Al, Ti and Ni; metal oxides, such as MgO, SiO, $SiO_2$, $Al_2O_3$, GeO, $Fe_2O_3$, $Y_2O_3$ and $TiO_2$; metal fluorides, such as $MgF_2$, LiF, $AlF_3$ and $CaF_2$; polyethylene, polypropylene, polymethyl methacrylate, polyimide, polyurea, polytetrafluoroethylene, polychlorotrifluoroethylene, polydichlorodifluoroethylene, copolymer of chlorotrifluoroethylene and dichlorodifluoroethylene, copolymers prepared by polymerizing a mixture of tetrafluoroethylene and at least one comonomer, and fluorine-containing copolymers having cyclic structures on the main chain; a water-absorbing substance having a water absorption rate of at least 1%; and a moistureproof substance having a water absorption rate of at most 0.1%.

The protective layer also has no particular restriction as to the formation method, but any of a vacuum evaporation method, a sputtering method, a reactive sputtering method, a molecular beam epitaxy (MBE) method, a cluster ion beam method, an ion plating method, a plasma polymerization method (high frequency excitation ion plating method), a plasma chemical vapor deposition (CVD) method, a laser CVD method, a heat CVD method, a gas source CVD method and a coating method can be adopted for the formation thereof.

The present invention will now be illustrated in greater detail by reference to the following Examples, but the invention should not be construed as being limited thereto.

PRODUCTION AND EVALUATION OF ORGANIC LUMINOUS DEVICE

COMPARATIVE EXAMPLE 1

A washed ITO substrate was installed in a vacuum evaporator, and a 40 nm-thick layer of N,N'-diphenyl-N,N'-ditolylbenzidine (TPD), a 20 nm-thick layer of tris(8-hydroxyquinolinato)aluminum (Alq) and a 40 nm-thick layer of 2-(4-tert-butylphenyl)-4-biphenylyl-1,3,4-oxadiazole (PBD) were sequentially vapor deposited thereon. On the thus formed organic thin lamination was set a patterned mask (for adjusting the emission area to 5 mm×5 mm). Inside the vacuum evaporator, Mg and Ag were further codeposited at a Mg/Ag ratio of 10/1 to form a metallic layer having a thickness of 50 nm, followed by deposition of a 50 nm-thick Ag layer.

The thus produced organic luminous device was allowed to luminesce by applying thereto a DC constant voltage by means of a source measure unit, Model 2400, made by Toyo Technica Corp. The luminance and the wavelength of the luminescence emitted were measured with a luminometer BM-8 made by Topcon Corp. and a spectrum analyzer PMA-11 made by Hamamatsu Photonics K.K., respectively.

When a DC constant voltage of 12 V was applied, the device gave off green-color luminescence having $EL_{max}$ at the wavelength of 520 nm and a maximum luminance of 1,250 $cd/m^2$ (12 V).

The organic compounds used are shown below.

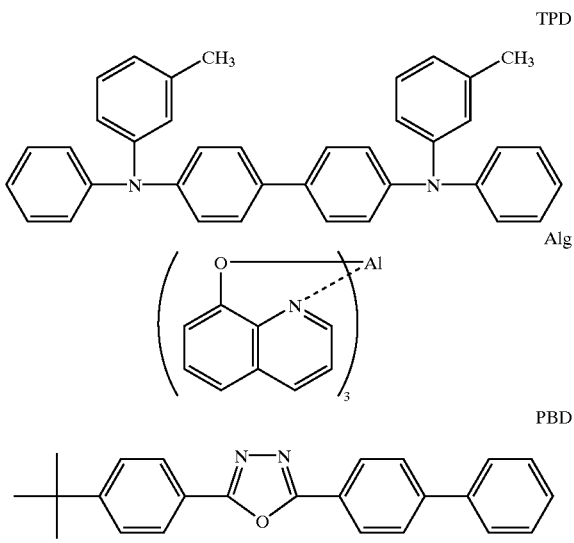

COMPARATIVE EXAMPLE 2

A washed ITO substrate was installed in a vacuum evaporator, and a 40 nm-thick layer of TPD, a 20 nm-thick layer of Alq and a 40 nm-thick layer of Comparative Compound A shown below were sequentially vapor deposited thereon. On the thus formed organic thin lamination was set a patterned mask (for adjusting the emission area to 5 mm×5 mm). Inside the vacuum evaporator, Mg and Ag were further codeposited at a Mg/Ag ratio of 10/1 to form a metallic layer having a thickness of 50 nm, followed by deposition of a 50 nm-thick Ag layer.

A voltage of 12 V was applied to the thus produced organic luminous device, and thereby the green-color luminescence having $EL_{max}$ at the wavelength of 520 nm was given off, and the maximum luminance thereof was 1,720 $cd/m^2$ (12 V).

Comparative Compound A

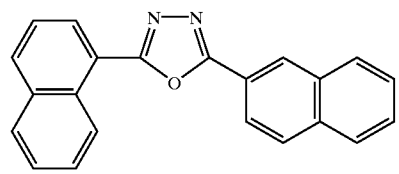

COMPARATIVE EXAMPLE 3

Poly-N-vinylcarbazole (PVK) in an amount of 40 mg, 0.5 mg of coumarin-6 and 12 mg of PBD were dissolved in 2 ml of 1,2-dichloroethane, and then coated on a washed ITO substrate by means of a spin coater while the revolution rate of the spin coater was controlled so as to provide a coating having a thickness of 100 nm. The thus coated substrate was installed in a vacuum evaporator, and on the organic thin coating was set a patterned mask (for adjusting the emission area to 5 mm×5 mm). Inside the vacuum evaporator, Mg and Ag were further codeposited at a Mg/Ag ratio of 10/1 to form a metallic layer having a thickness of 50 nm, followed by deposition of a 50 nm-thick Ag layer.

A voltage of 18 V was applied to the thus produced organic luminous device, and thereby the green-color luminescence having $EL_{max}$ at the wavelength of 525 nm was given off, and the maximum luminance thereof was 1,160 cd/m$^2$ (18 V).

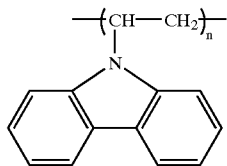

PVK

EXAMPLE 1

A luminous device was produced in the same manner as in Comparative Example 1, except that the invention compound EC-1 was used in place of PBD, and evaluated by the same method as in Comparative Example 1. When a voltage of 10 V was applied thereto, the luminous device gave off green-color luminescence having $EL_{max}$ at the wavelength of 520 nm and a maximum luminance of 3,530 cd/m$^2$ (10 V).

EXAMPLE 2

A luminous device was produced in the same manner as in Comparative Example 2, except that the invention compound EC-5 was used in place of Comparative Compound A, and evaluated by the same method as in Comparative Example 2. When a voltage of 9 V was applied thereto, the luminous device gave off green-color luminescence having $EL_{max}$ at the wavelength of 520 nm and a maximum luminance of 4,270 cd/m$^2$ (9 V).

EXAMPLE 3

A luminous device was produced in the same manner as in Comparative Example 1, except that the invention compound EC-15 was used in place of PBD, and evaluated by the same method as in Comparative Example 1. When a voltage of 9 V was applied thereto, the luminous device gave off green-color luminescence having $EL_{max}$ at the wavelength of 520 nm and a maximum luminance of 6,700 cd/m$^2$ (9 V).

EXAMPLE 4

A luminous device was produced in the same manner as in Comparative Example 1, except that the invention compound EC-17 was used in place of PBD, and evaluated by the same method as in Comparative Example 1. When a voltage of 9 V was applied thereto, the luminous device gave off green-color luminescence having $EL_{max}$ at the wavelength of 520 nm and a maximum luminance of 7,200 cd/m$^2$ (9 V).

EXAMPLE 5

A luminous device was produced in the same manner as in Comparative Example 3, except that the invention compound EC-1 was used in place of PBD, and evaluated by the same method as in Comparative Example 3. When a voltage of 16 V was applied thereto, the luminous device gave off green-color luminescence having $EL_{max}$ at the wavelength of 525 nm and a maximum luminance of 2,970 cd/m$^2$ (16 V).

EXAMPLE 6

A luminous device was produced in the same manner as in Comparative Example 3, except that the invention compound EC-5 was used in place of PBD, and evaluated by the same method as in Comparative Example 3. When a voltage of 15 V was applied thereto, the luminous device gave off green-color luminescence having $EL_{max}$ at the wavelength of 525 nm and a maximum luminance of 2,850 cd/m$^2$ (15 V).

EXAMPLE 7

A luminous device was produced in the same manner as in Comparative Example 3, except that the invention compound EC-1 was used in place of PBD, and evaluated by the same method as in Comparative Example 3. When a voltage of 15 V was applied thereto, the luminous device gave off green-color luminescence having $EL_{max}$ at the wavelength of 525 nm and a maximum luminance of 3,870 cd/m$^2$ (15 V).

EXAMPLE 8

A luminous device was produced in the same manner as in Comparative Example 3, except that the invention polymeric compound EC-37 was used in place of PBD, and evaluated by the same method as in Comparative Example 3. When a voltage of 18 V was applied thereto, the luminous device gave off green-color luminescence having $EL_{max}$ at the wavelength of 525 nm and a maximum luminance of 3,460 cd/m$^2$ (18 V).

The luminous devices produced in Comparative Examples 1 to 3 and Examples 1 to 8 were kept for 3 days at 5° C. in a preservation container purged of nitrogen. Thereafter, these devices were each examined for luminance in the same way as mentioned above. As to the devices produced in Comparative Examples 1 to 3 and Examples 1, 2, 5 and 6, practically no luminescence was observed. In contrast, the devices produced in Examples 3, 4 and 7 gave off strong luminescence similar to what they did before the storage, although the luminance was somewhat deteriorated.

The 1,2,4-oxadiazole compounds according to the invention have excellent ability to transport electrons, as compared to conventional heterocyclic compounds. In particular, the fluorine-substituted compounds and the polymeric compounds are also superior in raw stock storability.

While the invention has been described in detail and with reference to specific examples thereof, it will be apparent to one skilled in the art that various changes and modifications can be made therein without departing from the spirit and scope thereof.

What is claimed is:

1. An organic luminous device comprising an anode and a cathode, and at least one organic layer which comprises a 1,2,4-oxadiazole compound represented by formula (1), or comprises a homopolymer or copolymer produced from monomers comprising at least one monomer unit derived from said 1,2,4-oxadiazole compound represented by formula (1):

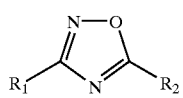 (1)

wherein $R_1$ and $R_2$ each independently represents a hydrogen atom, an alkyl group, an alkenyl group, an alkynyl group, a substituted aryl group or a heterocyclic group, wherein the substituent for the substituted aryl group represented by $R_1$ and $R_2$ is selected from the group consisting of alkyl, aryl, heterocyclic and alkoxy groups and fluorine atom, and said at least one organic layer is interposed between said anode and said cathode.

2. The organic luminous device according to claim 1, wherein $R_1$ and $R_2$ in formula (1) each independently is a substituted aryl group or a heterocyclic group.

3. The organic luminous device according to claim 1, wherein either or both of $R_1$ and $R_2$ is substituted with a fluorine atom or a substituent containing a fluorine atom.

4. The organic luminous device according to claim 1, which comprises a homopolymer or copolymer produced from monomers comprising at least one monomer unit derived from said 1,2,4-oxadiazole compound represented by formula (1), wherein said homopolymer or copolymer has a number-average molecular weight of not higher than 1,000,000.

5. The organic luminous device according to claim 4, wherein said molecular weight is from 10,000 to 200,000.

6. The organic luminous device according to claim 1, wherein said organic layer is a coated organic layer.

7. The organic luminous device according to claim 1, wherein said at least one organic layer comprises a luminous layer and at least one of a hole injection layer, a hole transport layer, an electron injection layer, an electron transport layer and a protective layer.

\* \* \* \* \*